(12) United States Patent
Lee

(10) Patent No.: US 12,067,294 B2
(45) Date of Patent: Aug. 20, 2024

(54) INTERFACE CIRCUIT FOR CONVERTING A SERIAL DATA STREAM TO A PARALLEL DATA SCHEME WITH DATA STROBE PREAMBLE INFORMATION IN THE SERIAL DATA STREAM

(71) Applicant: Rambus Inc., San Jose, CA (US)

(72) Inventor: Dongyun Lee, Sunnyvale, CA (US)

(73) Assignee: Rambus Inc., San Jose, CA (US)

( * ) Notice: Subject to any disclaimer, the term of this patent is extended or adjusted under 35 U.S.C. 154(b) by 267 days.

(21) Appl. No.: 17/833,657

(22) Filed: Jun. 6, 2022

(65) Prior Publication Data

US 2022/0405016 A1    Dec. 22, 2022

Related U.S. Application Data

(60) Provisional application No. 63/211,994, filed on Jun. 17, 2021.

(51) Int. Cl.
| | |
|---|---|
| *G11C 7/10* | (2006.01) |
| *G06F 3/06* | (2006.01) |
| *G11C 11/4093* | (2006.01) |

(52) U.S. Cl.
CPC ............ *G06F 3/0659* (2013.01); *G06F 3/061* (2013.01); *G06F 3/0673* (2013.01); *G11C 7/1093* (2013.01); *G11C 11/4093* (2013.01)

(58) Field of Classification Search
CPC ...... G06F 3/0659; G06F 3/061; G06F 3/0673; G11C 7/1093; G11C 11/4093
USPC ........................................................ 365/219
See application file for complete search history.

(56) References Cited

U.S. PATENT DOCUMENTS

| | | | |
|---|---|---|---|
| 6,292,116 B1 * | 9/2001 | Wang | H03K 19/17744 375/376 |
| 9,665,507 B2 | 5/2017 | Shaeffer et al. | |
| 2018/0151205 A1 * | 5/2018 | Jo | G11C 7/22 |

* cited by examiner

*Primary Examiner* — Huan Hoang
(74) *Attorney, Agent, or Firm* — Lowenstein Sandler LLP

(57) ABSTRACT

Technologies for converting serial data stream to a parallel data and strobe scheme with data strobe preamble information in the serial data stream are described. A device includes an interface circuit that receives a serial data stream and converts the serial data stream to parallel data and a data strobe (DQS) signal associated with the parallel data using N-bit header fields inserted into the serial data stream. The N-bit header fields specify DQS preamble information for the parallel data.

20 Claims, 10 Drawing Sheets

Read Preamble

| Function | Register Type | Operand | Data |
|---|---|---|---|
| Read Preamble Settings | R/W | OP[2:0] | 000₈: 1 tCK – 10 Pattern<br>001₈: 2 tCK – 0010 Pattern<br>010₈: 2 tCK – 1110 Pattern (DDR4 Style)<br>011₈: 3 tCK – 000010 Pattern<br>100₈: 4 tCK – 00001010 Pattern<br>101₈: Reserved<br>110₈: Reserved<br>111₈: Reserved |

INTERFACE CIRCUIT FOR CONVERTING A SERIAL DATA STREAM TO A PARALLEL DATA SCHEME WITH DATA STROBE PREAMBLE INFORMATION IN THE SERIAL DATA STREAM

RELATED APPLICATIONS

The present application claims the benefit under 35 U.S.C. § 119(e) of U.S. Provisional Patent Application No. 63/211,994, filed Jun. 17, 2021, the entire contents of which are incorporated by reference herein.

BACKGROUND

Modern computer systems generally include a data storage device, such as a memory component or device. The memory component may be, for example, a random access memory (RAM) device or a dynamic random access memory (DRAM) device. The memory device includes memory banks made up of memory cells that a memory controller or memory client accesses through a command interface and a data interface within the memory device.

BRIEF DESCRIPTION OF THE DRAWINGS

The present disclosure is illustrated by way of example, and not by way of limitation, in the figures of the accompanying drawings.

DETAILED DESCRIPTION

The following description sets forth numerous specific details, such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

The present disclosure is directed to embodiments of interface circuits for converting serial data streams to a parallel data scheme of a memory device with data strobe preamble information in the serial data stream. As described above, a host-side serial protocol has the benefit of pin efficiency and increased throughput. A downstream device still needs to generate a data strobe (DQS) to drive a DRAM device. Modifying the host to send a DQS or write clock signal, separate from the serial data becomes less efficient and technically more difficult for speeds greater than 25 Gbps.

Aspects of the present disclosure overcome the deficiencies noted above and others by providing an interface circuit that receives a serial data stream and converts the serial data stream to parallel data and a data strobe associated with the parallel data using N-bit header fields inserted into the serial data stream. The N-bit header fields specify the data strobe preamble information for the parallel data. The DQS information is included in serial interface (I/F) DQ and used to generate parallel I/F DQ and DQS. When DQ is delivered in the serial I/F, DQS is efficiently generated at the receiver side with minimal latency and with minimal circuitry, as described herein. The preamble at the parallel DQ side can be programmable to accommodate multiple implementations.

In at least one embodiment, a device includes an interface circuit that receives a serial data stream and converts the serial data stream to parallel data and a DQS signal associated with the parallel data using N-bit header fields inserted into the serial data stream. The N-bit header fields specify DQS preamble information for the parallel data. Additional details of the interface circuits are described below with respect to the embodiments of FIG. 1.

Figure 1:
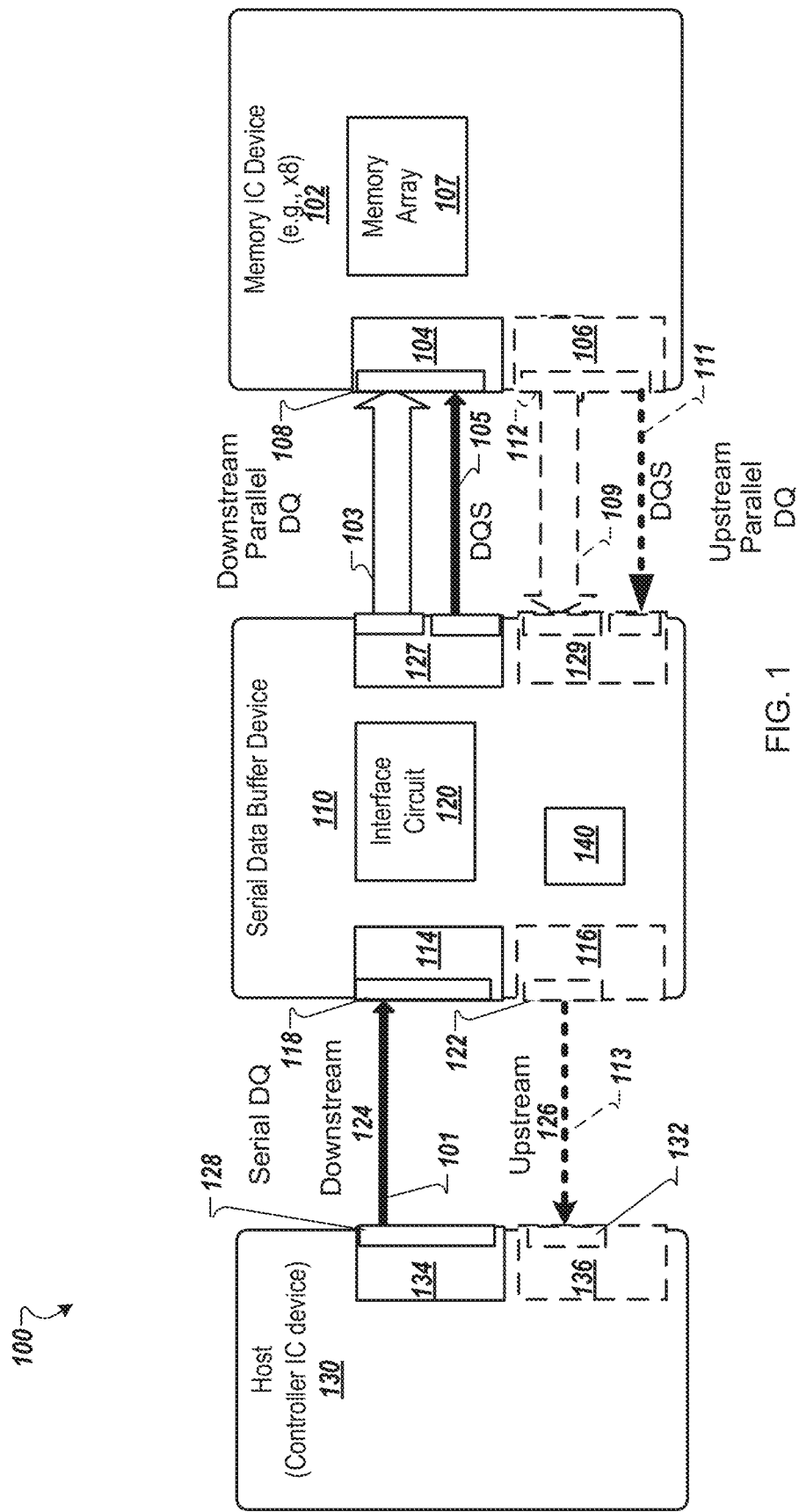
FIG. 1 is a block diagram of a memory system with an integrated circuit memory device with a parallel data and strobe scheme and a serial data buffer device for converting serial data stream to the parallel data and strobe scheme using DQS preamble information, according to at least one embodiment.

FIG. 1 is a block diagram of a memory system 100 with an integrated circuit memory device 102 with a parallel data and strobe scheme and a serial data buffer device 110 for converting serial data stream to the parallel data and strobe scheme using DQS preamble information, according to at least one embodiment. The integrated circuit memory device 102 (hereinafter "memory device 102") includes a first parallel interface 104, a second optional parallel interface 106, and a memory array 107. The first parallel interface 104 includes an input port 108 and a control port (not illustrated in FIG. 1). The second parallel interface 106 includes an output port 112 and a control port (not illustrated in FIG. 1). In at least one embodiment, the input port 108 and the output port 112 are unidirectional ports. In at least one embodiment, the ports are bidirectional ports. In this case, the first parallel interface 104 operates as both the downstream and upstream serial interfaces.

In at least one embodiment, the input port 108, the output port 112, and the control ports (not illustrated) are coupled to a serial data buffer (SDB) device 110 that is coupled to a downstream serial link 124 and an upstream serial link 126 with a host device 130 (also referred to as a host-computing device or controller integrated circuit (IC) device). The SDB device 110 includes an interface circuit 120, a downstream serial interface 114, an upstream serial interface 116, a first parallel interface 127, and an optional second parallel interface 129. The downstream serial interface 114 includes an input port 118 and a control port (not illustrated in FIG. 1). The upstream serial interface 116 includes an output port 122 and a control port (not illustrated in FIG. 1). In at least one embodiment, the input port 118 and the output port 122 are unidirectional ports. In at least one embodiment, the ports are bidirectional ports. In this case, the serial interface 124 operates as both the downstream and upstream serial interfaces. In at least one embodiment, the interface circuit 120 is a serializer-deserializer (SerDes) device.

In at least one embodiment, the input port 118 receives serial data 101. The serial data 101 includes N-bit header fields that specify data strobe preamble information. The interface circuit 120 converts the serial data 101 into parallel data 103 and a first timing reference, such as a data strobe signal 105 (e.g., DQS signal). The interface circuit 120 generates the parallel data 103 and the data strobe signal 105 using N-bit header fields inserted into the serial data 101. In at least one embodiment, the first timing reference includes a write data strobe signal (WDQS). In at least one embodiment, the strobe signal is a differential signal and includes two strobe signals. The N-bit header fields specify DQS preamble information for the parallel data 103.

In at least one embodiment, the input port 108 receives parallel data 103 and the first timing reference, such as illustrated by the data strobe signal 105 (e.g., DQS signal). The first timing reference can be differential clock strobes (e.g., DQS[1:0]_t/c). The first timing reference can be a single-ended strobe signal. The parallel data 103 can include write data. In some embodiments, the same interface is used for read data on an upstream interface, even though illustrated as two interfaces in FIG. 1. The control port can receive one or more control signals that specify a chip select type signal, a strobe signal, an enable signal, a command enable signal, a command type signal, an address, or the like. In at least one embodiment, the output port 112 transmits output data 109 and a second timing reference 111. The output data 109 can be read data, status data, error data, write acknowledgments, or the like. The second timing reference 111 can be a data strobe signal, such as differential data strobes (e.g., RDQS[1:0]_t/c). The second timing reference 111 can be a differential strobe signal or a single-ended strobe signal. In at least one embodiment, the input port 108 receives write data, and output port 112 transmits read data at different times when using the same data bus for read and write data. In another embodiment, the input port 108 receives write data, and output port 112 transmits read data concurrently. In at least one embodiment, the input port 108 receives command data, and the output port 112 transmits read data concurrently. The control port can transmit one or more control signals that specify that the output port 112 is enabled or ready with the read data. For example, the control port transmits an output enable signal that specifies that the output port 112 is enabled for the read data. The output enable signal can be a chip select type signal, a strobe signal, an enable signal, a command enable signal, or the like.

In at least one embodiment, the input port 108 and the output port 112 allow for concurrent interface operations, such as write data and read data being transferred concurrently or at the same time. The input port 108 and the output port 112 allow a closer match to the host-side serial downstream and serial upstream bandwidths. Using the separate input port 108 and the output port 112, there are no turn-around delays because the read and write transfers can co-occur. This can reduce the overall latency of the memory device 102.

In at least one embodiment, the parallel data 103 includes input packets that are write data packets. Alternatively, the input packet can include data and error correction code (ECC) data. The parallel data 103 can include the following packet examples, <DATA> or <DATA:ECC>. In at least one embodiment, the output data 109 includes output packets. The output packet can include read data, status data, data and ECC data, or status data and ECC data. The output data 109 can include the following packet examples, <DATA>; <STATUS>, <DATA:ECC> or <STATUS:ECC>. It should be noted that the ECC data can be implemented in different manners.

In at least one embodiment, the output port 112 is coupled to or includes driver circuitry. The driver circuitry is used to drive signals on the output port 112. In at least one embodiment, the driver circuitry transmits the read data or other output data 109. In at least one embodiment, the driver circuitry transmits the output data 109 and the second timing reference 111. In contrast, a bi-directional port includes both a driver and a receiver. In at least one embodiment, the input port 108 is a unidirectional port coupled to receiver circuitry and does not include driver circuitry. This can reduce the capacitance on the input port 108. Reducing the capacitance on the input port 108 can increase receivers' margins and allow them to operate at a higher frequency. In at least one embodiment, the receivers of the input port 108 can operate at different frequencies than transmitters of the output port 112. For example, in one embodiment, the receivers can operate at a higher frequency than the transmitters. In other embodiments, the receivers and the transmitters can operate at the same frequency. In at least one embodiment, the input port 108 is a bidirectional port coupled to receiver circuitry and driver circuitry. In this embodiment, there is no output port 112. In at least one embodiment, the memory device 102 is compatible with a Joint Electron Device Engineering Council (JEDEC) memory standard. For example, the memory device 102 can have the pinout of the double data rate (DDR) DRAM memory device. The memory device can optionally operate with bi-modality. The bi-modality can be configurable.

In at least one embodiment, the output port of the first parallel interface 127 of the SDB device 110 is coupled to or includes driver circuitry. The driver circuitry is used to drive the signals corresponding to the parallel data 103 and the DQS signal 105 to the memory device 102. In at least one embodiment, the input port of the second parallel interface 129 of the SDB device 110 is coupled to or includes receiver circuitry. The receiver circuitry is used to receive signals corresponding to the parallel data 109 and the DQS signal 111 from the memory device 102. In contrast, bi-directional ports can be used that include both a driver and a receiver. In at least one embodiment, the input port 118 of the SDB device 110 is coupled to or includes receiver circuitry. The receiver circuitry is used to receive serial data 101 from the host device 130. In at least one embodiment, the output port 122 of the SDB device is coupled to or includes driver circuitry. The driver circuitry is used to drive the serial data 113 to the host device 130.

In at least one embodiment, the downstream serial interface 114 includes a receiver, and the upstream serial interface 116 includes a transmitter. The downstream serial interface 114 can include a differential pair of receivers, and the upstream serial interface 116 can include a differential pair of transmitters. For example, an SDB device coupled to two memory devices can have two differential pairs of transmitters and two differential pairs of receivers. In at least one embodiment, the downstream serial link 124 includes a differential pair of receiver lines, and the upstream serial link 126 includes a differential pair of transmitter lines. In at least one embodiment, the downstream serial interface 114 can include an optical-to-electrical (O2E) converter that converts an optical signal to an electrical signal. The upstream serial interface 116 can include an electrical-to-optical (E2O) converter that converts an electrical signal to an optical signal. In another embodiment, the SDB device 110 can be an optical SDB device with an optical interface coupled to optical links with the host and an electrical interface coupled to the memory device 102. Additional details of the SDB devices are described below with respect to FIGS. 2-10.

In at least one embodiment, during operation, the SDB device 110 (or the interface circuit 120) receives a serial data stream (e.g., 101) from the host device 130 via the downstream serial interface 114. The SDB device 110 (or the interface circuit 120) converts the serial data stream to parallel data 103 and the DQS signal 105 associated with the parallel data 103 using N-bit header fields inserted into the serial data stream. As described above, the N-bit header fields specify DQS preamble information for the parallel data 103. The SDB device 110 (or the interface circuit 120) provides the parallel data 103 and the DQS signal 105 to the memory IC device 102 via a parallel interface.

In at least one embodiment, the interface circuit 120 converts the serial data stream into N-bit packets, where N is a positive integer greater than one. The N-bit packets include one or more data packets and a preamble packet. The interface circuit 120 decodes the N-bit packets. The interface circuit 120 generates the DQS signal 105 in response to the preamble packet being decoded in the serial data stream. In at least one embodiment, the DQS preamble information includes a DQS pattern corresponding to a clock cycle (tCKs) duration for a DQS period of the memory IC device 102. In at least one embodiment, the N-bit header fields include a synchronization packet, a synchronization and preamble packet, and a start of data transfer packet. Alternatively, the N-bit header fields include multiple synchronization packets, a synchronization and preamble packet, and a start of data transfer packet. The N-bit header fields can be one or more clock cycles in duration. In at least one embodiment, the N-bit header fields are two clock cycles in duration.

In at least one embodiment, the host device 130 is an integrated circuit controller device that includes a downstream serial interface 134 and an upstream serial interface 136. The downstream serial interface 134 includes an output port 128 and a control port (not illustrated). The upstream serial interface 136 includes an input port 132 and a control port (not illustrated). In at least one embodiment, the output port 128, the control ports, and the input port 132 are unidirectional ports. In another embodiment, the ports are bidirectional.

In at least one embodiment, the output port 128 is coupled to or includes driver circuitry. The driver circuitry is used to drive signals on the output port 128. In at least one embodiment, the driver circuitry transmits the serial data 101 to the SDB device 110. In at least one embodiment, the input port 132 is coupled to or includes receiver circuitry. The receiver circuitry is used to receive signals on the input port 132. In at least one embodiment, the receiver circuitry receives the serial data 113 from the SDB device 110. In contrast, bi-directional ports can be used that include both a driver and a receiver.

In at least one embodiment, the output port 128 transmits serial data 101 to a memory device 102 via the SDB device 110. As described above, the serial data 101 can include N-bit header fields that specify DQS preamble information that is used by the SDB device 110 to generate the parallel data 103 and the DQS signal 105. In at least one embodiment, the input port 132 receives serial data 113 from the SDB device 110 that is converted from the parallel data 109 from the memory IC device 102. The serial data 113 can be read data, status data, error data, write acknowledgments, or the like. The second timing reference 111 can be a clock signal, such as differential clock strobes (e.g., RDQS[1:0]_t/c). The second timing reference 111 can be a differential clock signal or a single-ended clock signal or strobe.

Figure 2:
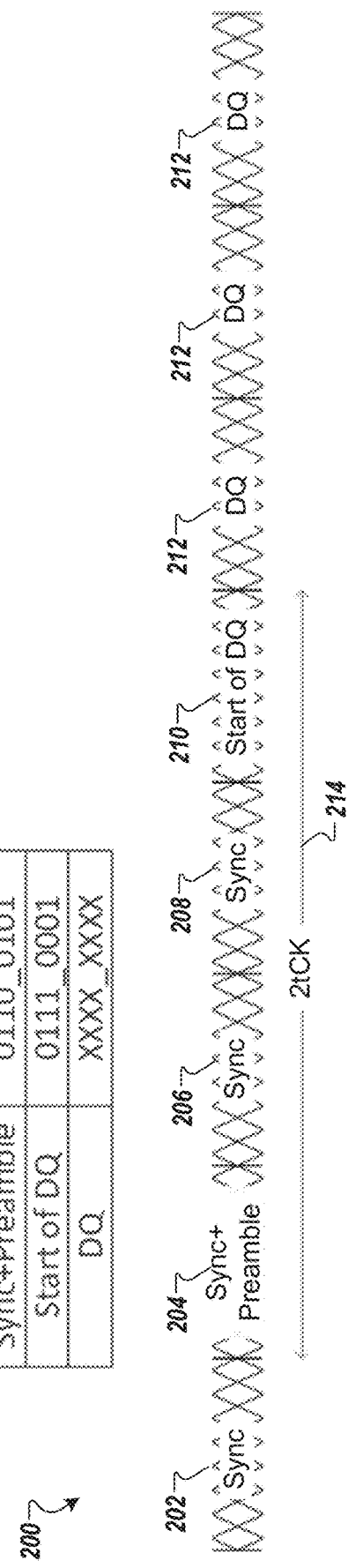
FIG. 2 illustrates a serial data stream with DQS preamble information for generating a DQS signal in a parallel data and strobe scheme, according to at least one embodiment.

As described above, N-bit header fields are inserted into the serial data 101 and the N-bit header fields specify DQS preamble information for the parallel data 103, such as illustrated in the serial data stream of FIG. 2.

FIG. 2 illustrates a serial data stream 200 with DQS preamble information for generating a DQS signal in a parallel data and strobe scheme, according to at least one embodiment. The serial data stream 200 includes multiple packets of various types, including a synchronization (sync) packet, a synchronization and preamble packet (also referred to as a preamble packet), a start of data packet, and a data packet. Each synchronization packet can include a first binary sequence of N bits. For example, in an 8-to-1 serialization, the first binary sequence can be 0101_0101. The first binary sequence can be decoded by a packet decoder as a synchronization packet. Each synchronization and preamble packet includes a second binary sequence of N bits. For example, in an 8-to-1 serialization, the second binary sequence can be 0110_0101. The second binary sequence can be decoded by a packet decoder as the synchronization and preamble packet. In response to the synchronization and preamble packet, the packet decoder can generate an appropriate DQS signal with a specified DQS pattern, as described below. Each start of data packet includes a third binary sequence of N bits. For example, in an 8-to-1 serialization, the third binary sequence can be 0111_0001. The third binary sequence can be decoded by a packet decoder as the start of data packet that identifies a start of a data transfer in the serial data.

In at least one embodiment, the DQS preamble is different for different memory implementations. That is, one memory device can have a DQS preamble requirement that specifies an expected DQS signal over one or more clock cycles and another memory device can have a different DQS requirement that specifies a different expected DQS signal over one or more clock cycles. The DQS preamble information can be programmable to include one of multiple DQS patterns. Each DQS pattern corresponds to a different clock cycle (tCKs) duration for a DQS period. For example, a 1 tCK preamble can have a pattern of 10 and a 2 tCK preamble can have a pattern of 0010 or 1110. For other examples, a 3 tCK preamble can have a pattern of 000010 and a 4 tCK preamble can have a pattern of 00001010.

Referring back to FIG. 2, the serial data stream 200 includes 8 bits serialized into one lane on a physical interface (or lambda over an optical interface) and uses a 2 tCK preamble information. The serial data stream 200 includes a first sync packet 202, a synchronization and preamble packet 204, a second sync packet 206, a third sync packet 208, and a start of data packet 210 before data packets 212. The synchronization and preamble packet 204, once decoded, causes a 2 tCK DQS signal to be generated. A 3 tCK preamble information has four sync packets 206 between a synchronization and preamble packet 204 and a start of data packet and causes a 3 tCK DQS signal to be generated. A 4 tCK preamble information has six sync packets 206 between a synchronization and preamble packet 204 and a start of data packet and causes a 4 tCK DQS signal to be generated. A 1 tCK preamble information has zero sync packet 206 between a synchronization and preamble packet 204 and a start of data packet and causes 1 tCK DQS signal to be generated.

As described above, the DQS preamble duration can be programmable. A register 140 can store preamble settings that specify one of multiple DQS patterns, such as illustrated in FIG. 3A.

Figures 3A, 3B:
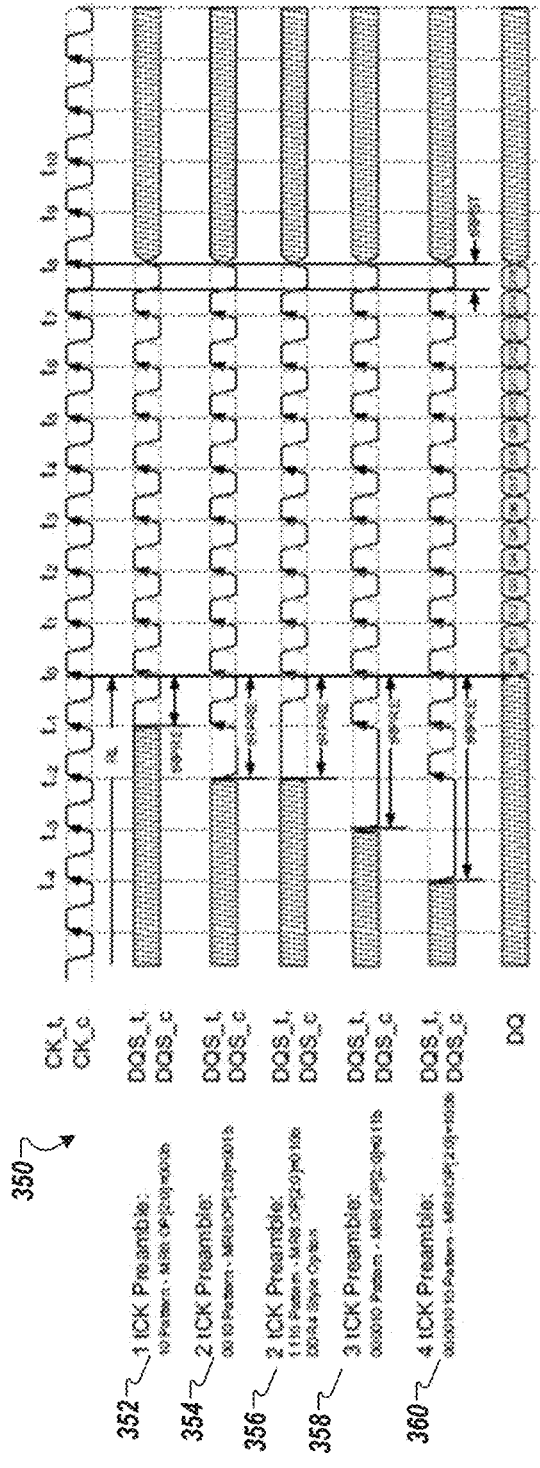
FIG. 3A is a table illustrating read preamble settings in a register that specifies a DQS pattern for a DQS signal, according to at least one embodiment.
FIG. 3B is a timing diagram of DQS preamble patterns, according to at least one embodiment.

FIG. 3A is a table 300 illustrating read preamble settings in a register that specifies a DQS pattern for a DQS signal, according to at least one embodiment. The table 300 specifies that the read preamble setting 302 can be programmed by an operand (e.g., OP[2:0]) identifying one of multiple DQS patterns. For example, the operand 000 corresponds to a 1 tCK pattern, 10. The operand 001 corresponds to a 2 tCK pattern, 0010. The operand 010 corresponds to a 2 tCK pattern, 1110. The operand 011 corresponds to a 3 tCK pattern, 000010. The operand 100 corresponds to a 4 tCK pattern, 00001010. Alternatively, other patterns can be used for the read preamble settings. Similar patterns can be specified for write preamble settings.

The DQS can also have an option to drive early by x-tCK to accommodate different host receiver designs as controlled by a read DQS in another register.

FIG. 3B is a timing diagram of DQS preamble patterns, according to at least one embodiment. For the 1 tCK pattern 352, the DQS signal (e.g., DQS_t, DQS_c) has a pattern of 10 in a single clock cycle before the data packets. For the 2 tCK pattern 354, the DQS signal (e.g., DQS_t, DQS_c) has a pattern of 0010 in two clock cycles before the data packets. For the 2 tCK pattern 356, the DQS signal (e.g., DQS_t, DQS_c) has a pattern of 1110 in two clock cycles before the data packets. For the 3 tCK pattern 358, the DQS signal (e.g., DQS_t, DQS_c) has a pattern of 000010 in three clock cycles before the data packets. For the 4 tCK pattern 358, the DQS signal (e.g., DQS_t, DQS_c) has a pattern of 00001010 in four clock cycles before the data packets.

Figure 4:
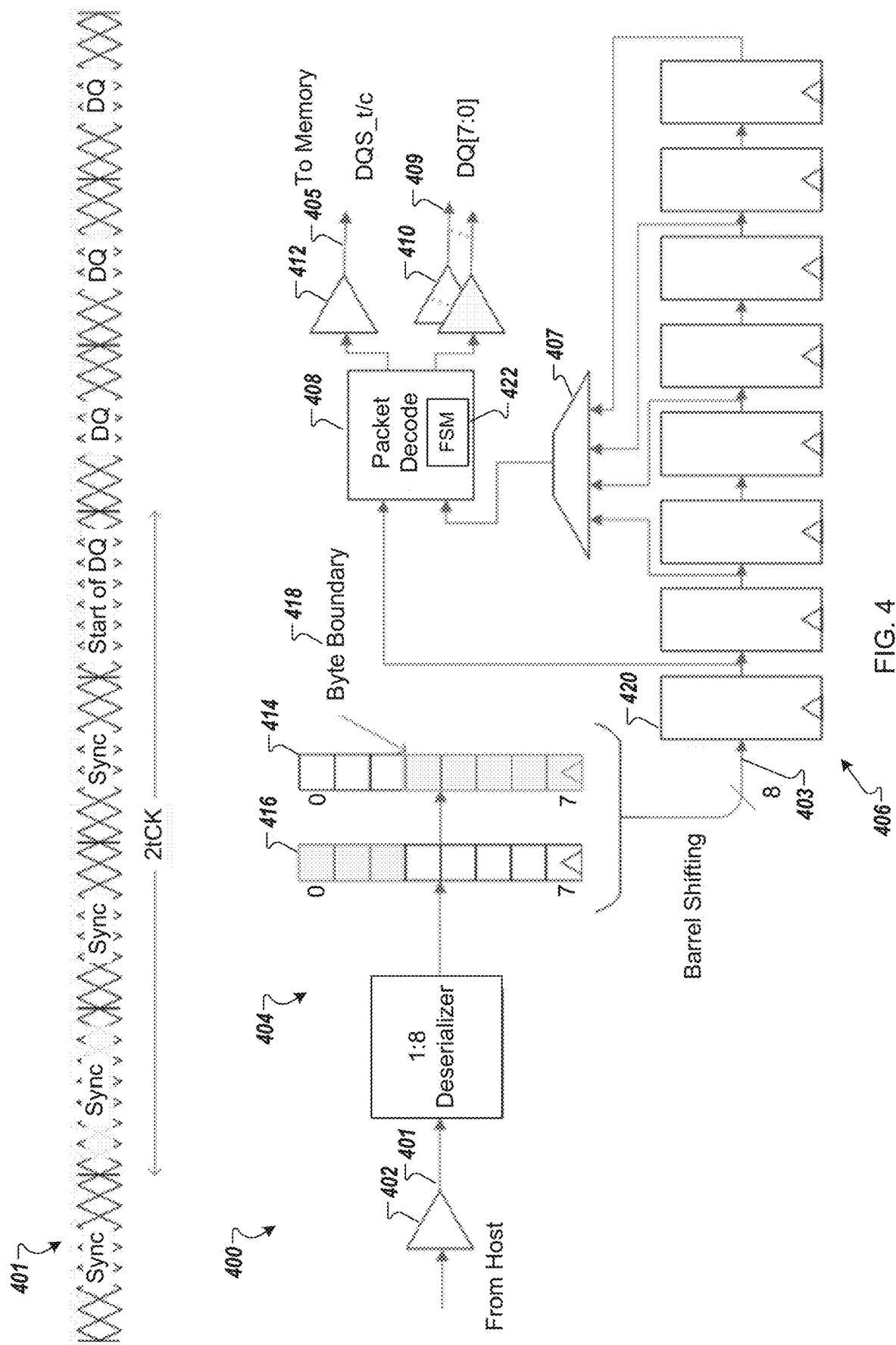
FIG. 4 is a block diagram of an interface circuit that does not use preamble information in a serial data stream, according to at least one embodiment.

FIG. 4 is a block diagram of an interface circuit 400 that does not use preamble information in a serial data stream, according to at least one embodiment. The interface circuit 400 includes an input driver 402, a deserializer circuit 404, a set of latches 406, a multiplexer 407, a packet decoder 408, a set of line drivers 410, and a strobe driver 412. The input driver 402 receives a serial data stream 401 over a serial link (e.g., lane or lambda) from a host device (not illustrated in FIG. 4) and drives the serial data stream 401 to the deserializer circuit 404. The deserializer circuit 404 receives the serial data stream 401 and converts the serial data stream into N-bit packets 403. The deserializer circuit 404 can include circuitry to store bits into two or more buffers. For example, the deserializer circuit 404 can include a 1:N deserializer that receives the serial data stream 401 and to store bits of the serial data stream 401 into one of a first buffer 414 or a second buffer 416, where N is a positive integer greater than one. The first buffer 414 stores a first portion of the N-bit packet according to a boundary indicator 418 and the second buffer 416 stores a second portion of the N-bit packet according to the boundary indicator 418. In at least one embodiment, the interface circuit can determine an exact boundary with training and protocol help. Once determined, the boundary indicator 418 can indicate the boundary for the N-bit packets stored in the two buffers. The first portion and the second portion are barrel shifted out of the first buffer 414 and the second buffer 416 as the N-bit packet 403. The deserializer circuit 404 in FIG. 4 is a 1:8 deserializer that outputs an 8-bit packet. Alternatively, the deserializer circuit 404 can output packets of other specified sizes.

In this embodiment, the N-bit packets 403 include at least the parallel data. The set of latches 406 store the N-bit packets 403 over multiple clock cycles. The multiplexer 407 is coupled to outputs of some of the set of latches. The packet decoder 408 is coupled to an output of a first latch 420 in the set of latches 406 and an output of the multiplexer 407. The packet decoder 408 decodes the N-bit packets and outputs the parallel data and a DQS signal. The set of line drivers 410 drive data signals corresponding to the parallel data 409 on a set of data lines of a memory device (not illustrated in FIG. 4) and the strobe driver drives the DQS signal 405 on a strobe line of the memory device. In at least one embodiment, the packet decoder 408 includes a finite state machine (FSM) 422. The packet decoder 408 decodes the output of the first latch 420 and drives the DQS signal 405 if a start of DQ packet is detected. The multiplexer 407 is selected based on one of the settings of the table 300 stored in a register according to at least one embodiment.

In at least one embodiment, a serial data stream (DQ stream) needs a first header and a period in which no data is sent, referred to as a sync header (or sync packet). This sync header can be an N-bit header. Since the DQ stream has an N-bit header, additional information can be added to the header for DQS generation. This modified header is referred to as a synchronization and preamble header or synchronization and preamble packet. The preamble information in the N-bit header can be used to generate the DQS as illustrated in FIG. 5.

Figure 5:
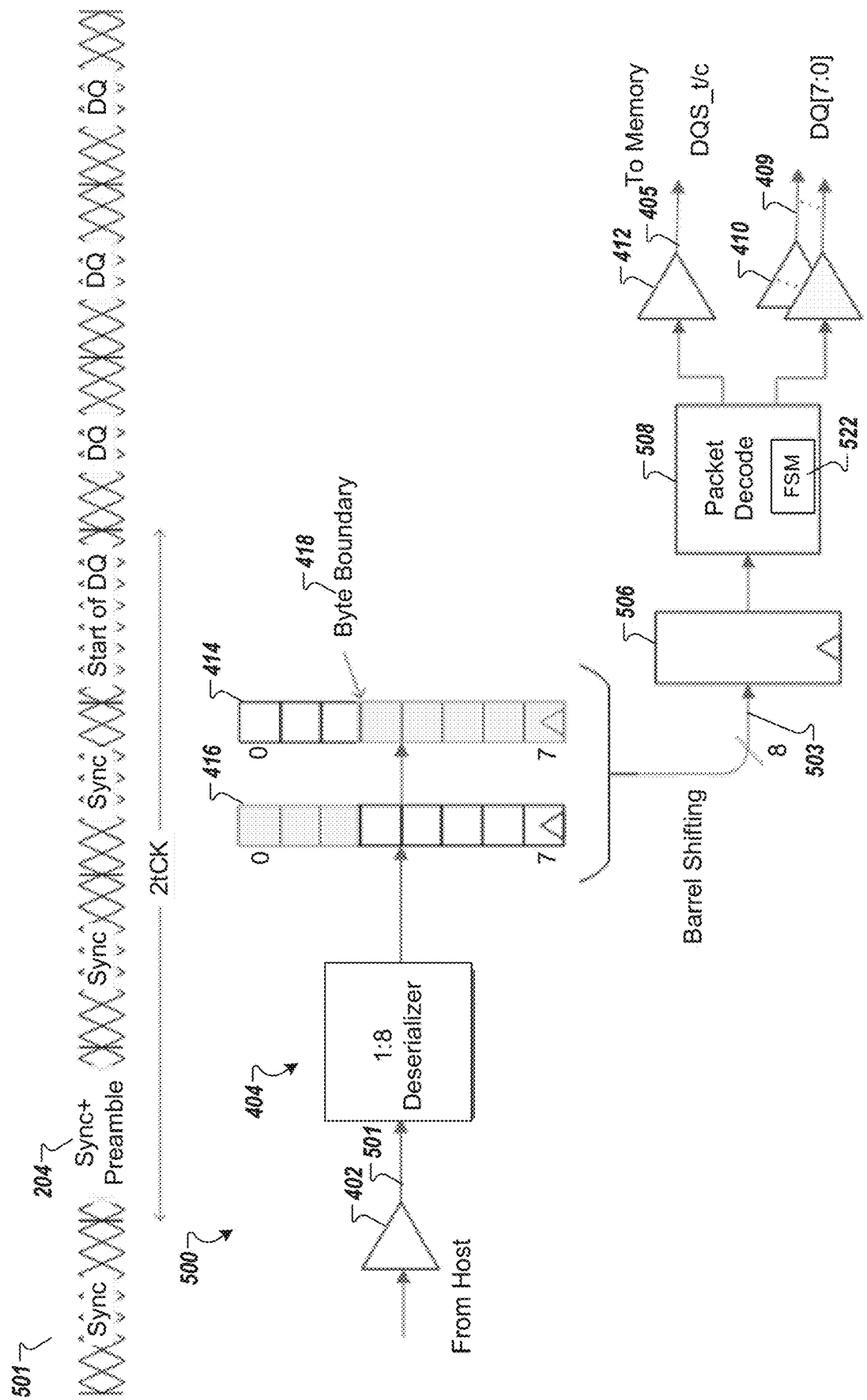
FIG. 5 is a block diagram of an interface circuit that uses preamble information in a serial data stream, according to at least one embodiment.

FIG. 5 is a block diagram of an interface circuit 500 that uses preamble information in a serial data stream, according to at least one embodiment. The interface circuit 500 is similar to interface circuit 400 as noted by similar reference numbers, except the interface circuit 500 is simplified using the preamble information in the serial data stream. That is, the serial data stream 501 includes the synchronization and preamble packet 204. The deserializer circuit 404 receives the serial data stream 501 and converts the serial data stream into N-bit packets 503. The N-bit packets include multiple sync packets, the synchronization and preamble packet 204 and the start of data packet before the data packets. The N-bit packets are stored in a latch 506. The packet decoder 508 is coupled to the output of the latch 506 and decodes the N-bit packets and outputs the parallel data 409 and the DQS signal 405. For example, the packet decoder 508 can decode the synchronization and preamble packet 204 to generate the DQS signal 405 with a specified DQS pattern before the parallel data 409 is sent to the memory device.

Figure 6:
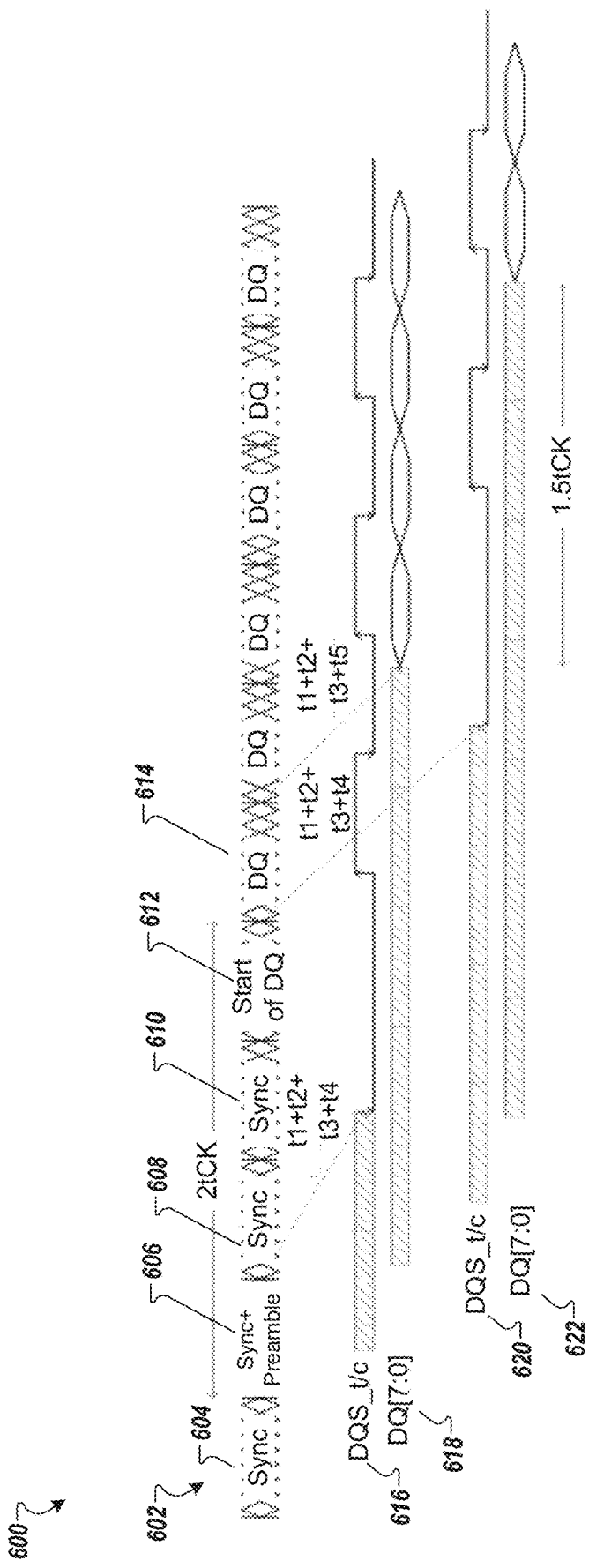
FIG. 6 is a timing diagram of the interface circuit 400 of FIG. 4 and the interface circuit 500 of FIG. 5, according to at least one embodiment.

The embodiments that use the DQS preamble information in the header of the serial data stream can reduce latency through a buffer between the serial host interface and the parallel memory interface, such as illustrated in FIG. 6.

FIG. 6 is a timing diagram 600 of the interface circuit 400 of FIG. 4 and the interface circuit 500 of FIG. 5, according to at least one embodiment. In the timing diagram 600, a serial data stream 602 includes a sync packet 604, a sync and preamble packet 606, a sync packet 608, a sync packet 610, and a start of DQ packet 612 before DQ packets 614. The memory device operates with a 2 tCK DQS preamble. The sync and preamble packet 606 can be used to generate a DQS signal with a 0010 pattern.

When the sync and preamble packet 606 is inserted into the serial data stream 602, the interface circuit can generate a DQS signal 616 with the 0010 pattern. There is a delay between receiving the sync and preamble packet 606 and the memory device receiving the DQS signal 616. The delay can be a sum of multiple delays, including a first delay, t1, a second delay, t2, a third delay, t3, and a fourth delay, t4. The first delay, t1, is the amount of time for byte alignment. The second delay, t2, is the time for barrel shifting and latching the packet (e.g., 1 clock cycle). The third delay, t3, is the time for packet decoding the packet. The fourth delay, t4, is the time for driving the DQS signal 616. After the start of DQ packet 612, the interface circuit receives data packets 614 in the serial data stream and converts and sends DQ signals 618 to the memory device as parallel data. There can be a delay between receiving the data packet 614 and the memory device receiving the DQ signals 618. The delay can be a sum of multiple delays, including t1, t2, t3, and a fifth delay, t5. The fifth delay, t5, is the time for DQ driving. The fifth delay, t5, is less than the fourth delay, t4, for write data. The fifth delay, t5, is equal to the fourth delay, t4, for read data.

The timing diagram 600 also shows a DQS signal 620 and DQ signals 622 when the sync and preamble packet 605 is not inserted into the serial data stream. The serial data stream can include another sync packet in the place of the sync and preamble packet 605. In this embodiment, the interface circuit generates the DQS signal 620 in response to the start of DQ packet 612, resulting in a 1.5 tCK delay between when the memory device receives the DQ signals 618 in the case where the sync and preamble packet 606 is inserted into the serial data stream 602 and the DQ signals 622 in the case where the sync and preamble packet 606 is not inserted into the serial data stream 602.

The embodiments that use the DQS preamble information in the header of the serial data stream can reduce the circuit components used in the buffer device, as illustrated in the interface circuit 500 of FIG. 5 as compared to the interface circuit 400 of FIG. 4. Because the DQS preamble information is included in the serial data stream, there is no need to add a separate DQS lane (or lambda) and there is no need to calibrate skew between lanes (or lambdas). Various embodiments described herein illustrate a 1:8 SerDes ratio. In other embodiments, other SerDes ratios can be used, such as 1:4. In at least one embodiment, the serial data stream can be modulated using a pulse amplitude modulation (PAM) scheme. In at least one embodiment, the DQ packets are modulated using PAM level 4 (PAM4) modulation and the sync and synchronization and preamble packets are modulated using PAM level 2 (PAM2). Alternatively, other modulation schemes may be used for the data packets or the sync and synchronization and preamble packets.

Figure 7:
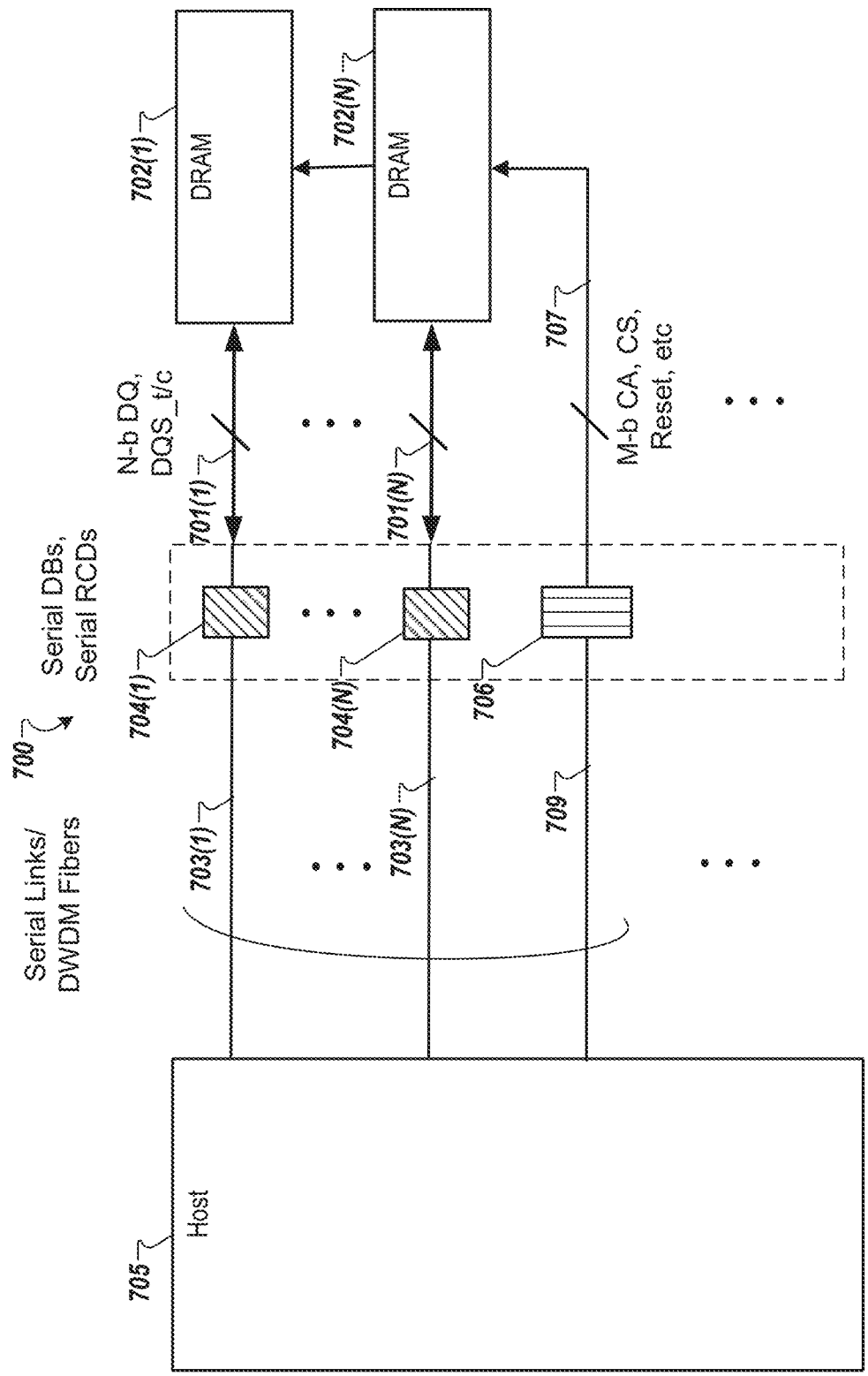
FIG. 7 is a block diagram of a memory system coupled to a host device, according to at least one embodiment.

In at least one embodiment, if command and address (CA) is communicated through a serial I/F from host to a second buffer (e.g., serial Register Clock Drivers (RCDs)), rank and/or channel information can be programmed into the synchronization packet or a Start of CA packet, such as illustrated in FIG. 7.

FIG. 7 is a block diagram of a memory system 700 coupled to a host device, according to at least one embodiment. The memory system 700 includes multiple DRAM devices 702 with parallel data and strobe interfaces 701 and multiple SDB devices 704, each having a serial interface and a parallel interface. The memory system 700 can be coupled to a host device 705 via serial links 703. In particular, the multiple SDB devices 704 couple to the host device 705 using the serial links 703. The serial links can be copper links. The serial links can be optical links (e.g., Dense Wavelength Division Multiplexing (DWDM) fiber links). The multiple SDB devices 704 couple to the DRAM devices 702 with parallel data and strobe interface 701. The multiple SDB devices 704 can be separate devices or can be integrated into a single device, such as an interface circuit that couples the host device 705 and the DRAM devices 702.

As illustrated in FIG. 7, N number of SDB device 704 are coupled between the host device 705 and corresponding DRAM devices 702. The DRAM devices 702 can be integrated circuit memory devices that operates according to a parallel data and strobe scheme. The SDB devices 704 can be part of an interface circuit or multiple interface circuits that receive one or more serial data streams from the host device 705 and convert each of the serial data streams to the parallel data and strobe scheme by using N-bit header fields inserted into the serial data stream as described above. Each of the N-bit header fields includes an information field that specifies DQS preamble information for the parallel data and strobe scheme being used by the DRAM device 702.

In at least one embodiment, the first SDB device 704(1) includes a serial data terminal coupled to the serial link 703(1), a set of parallel data terminals coupled to data terminals of the first DRAM device 702(1) via the parallel data and strobe interface 701(1), and a strobe terminal coupled to a strobe terminal of the first DRAM device 702(1). In at least one embodiment, the first SDB device 704(1) includes the interface circuit 500 of FIG. 5. An Nth SDB device 704(N) includes a serial data terminal coupled to the serial link 703(N), a set of parallel data terminals coupled to data terminals of the Nth DRAM device 702(N) via the parallel data and strobe interface 701(N), and a strobe terminal coupled to a strobe terminal of the Nth DRAM device 702(N).

In at least one embodiment, each of the SDB devices 704 includes a differential pair of receivers and a differential pair of transmitters for each of the serial links 703. Each of the SDB devices 704 includes receivers and transmitters for the set of drive lines and the strobe line of the parallel and strobe interfaces 701.

In another embodiment, as illustrated in FIG. 7, the host device 705 can communicate CA information on a serial link 709. A serial RCD buffer device 706 includes a serial interface coupled to the serial link 709 to receive CA information from the host device 705. The serial RCD buffer device 706 includes a parallel interface coupled to the N DRAM devices 702 via a parallel bus 707. The serial RCD buffer device 706 can program rank information, channel information, or the like, into a synchronization packet or start of CA packet sent over the parallel bus 707.

In at least one embodiment, the multiple SDB devices 704 and the serial RCD buffer device 706 are part of a single device. In other embodiments, the multiple SDB devices 704 and the serial RCD buffer device 706 are separate devices.

In at least one embodiment, timing calibration and tracking can be performed between the host device 705 and the DRAM devices 702.

Various embodiments described above are directed to serial data streams being sent by the host device to the memory devices. In other embodiments, the interface circuits can handle parallel data being received from the memory devices and converting the parallel data to serial data that is sent to the host device, such as illustrated in FIGS. 8-9.

Figure 8:
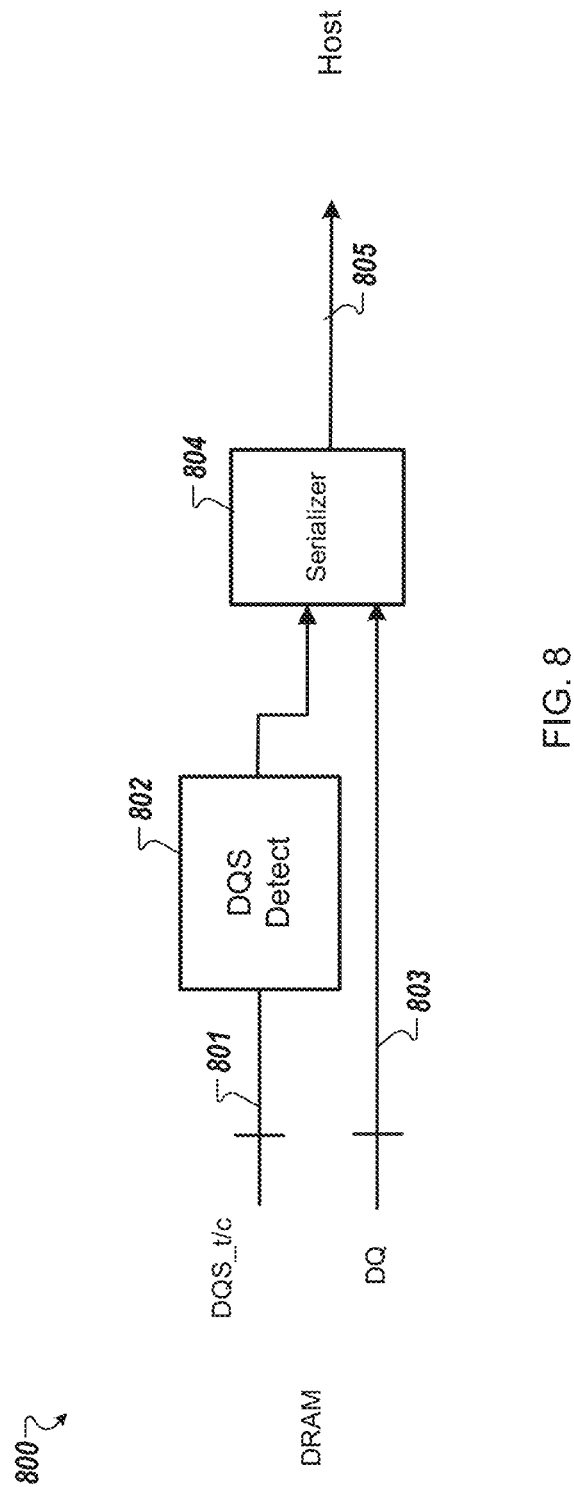
FIG. 8 is a block diagram of an interface circuit for converting parallel data and a DQS signal into a serial data stream, according to at least one embodiment.

FIG. 8 is a block diagram of an interface circuit 800 for converting parallel data and DQS signal into a serial data stream, according to at least one embodiment. The interface circuit 800 include a DQS detect circuit 802 and a serializer 804. The DQS detect circuit 802 receives a DQS signal 801 from a memory device (e.g., DRAM device). When the DQS detect circuit 802 detects the DQS signal 801, the DQS detect circuit 802 enables the serializer 804 to serialize parallel data 803 received from the memory device. The serializer 804 generates a serial data stream 805 and sends the serial data stream 805 to a host device.

Figure 9:
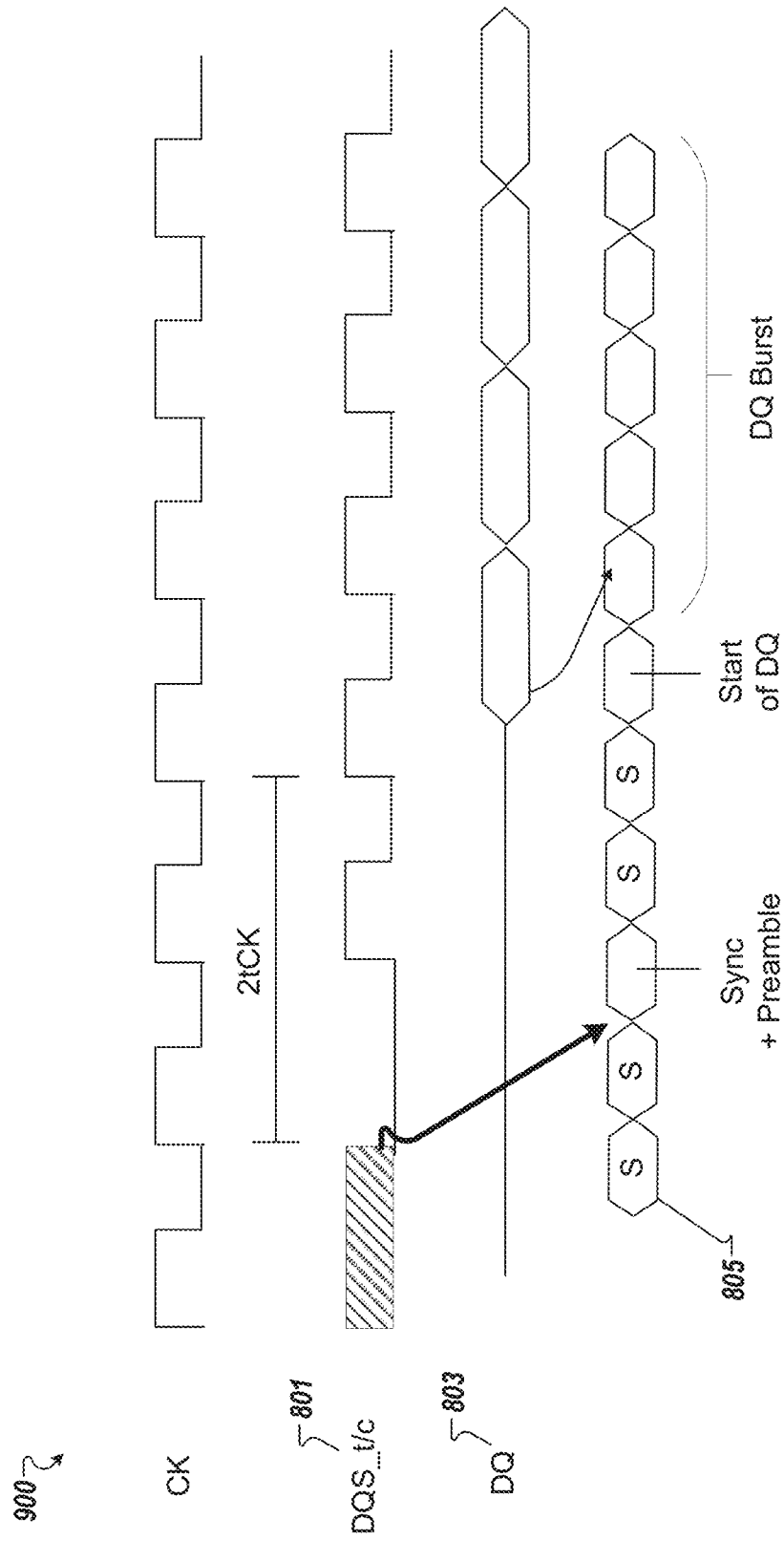
FIG. 9 is a timing diagram of a read data flow between a memory device and a host device using an interface circuit, according to at least one embodiment.

FIG. 9 is a timing diagram of a read data flow 900 between a memory device and a host device using an interface circuit, according to at least one embodiment. As described above, an interface circuit receives a DQS signal 801 and parallel data 803 from a memory device. In response to the DQS signal 801, the interface circuit generates a serial data stream 805, including a sync and preamble packet, one or more sync packets, and a start of data packet. The start of data packet is sent before the data packets of a DQ burst are sent to the host device.

Figure 10:
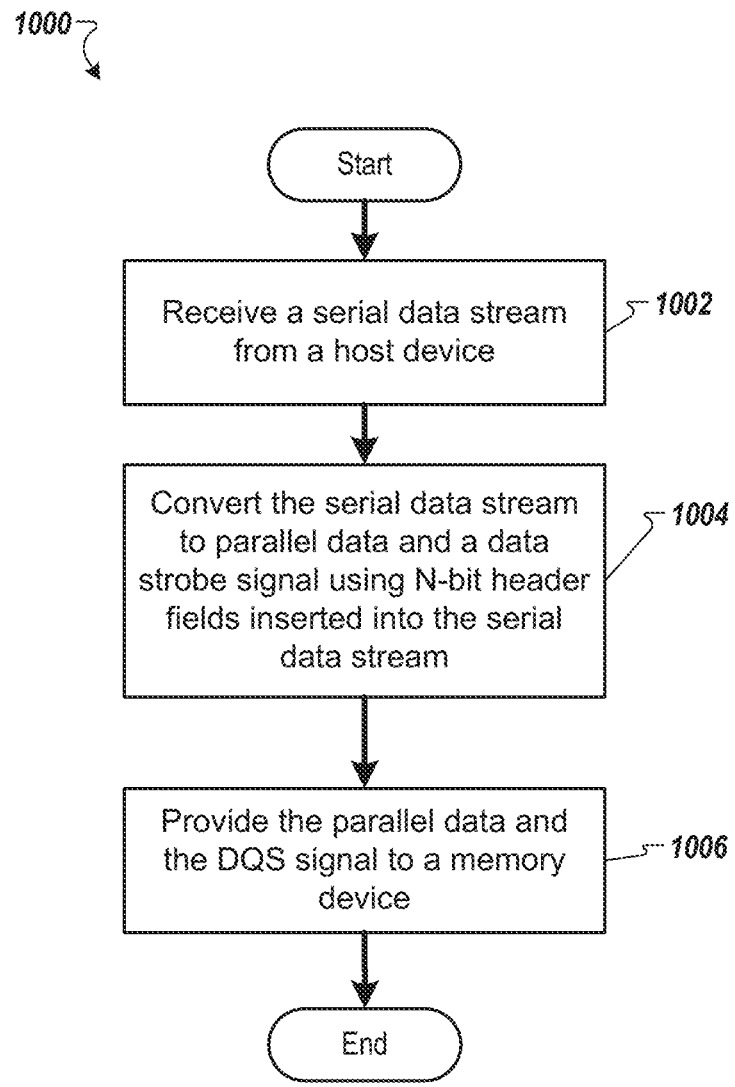
FIG. 10 is a flow diagram of a method 1000 for operating an interface circuit for converting a serial data stream to parallel data and a data strobe signal, according to an embodiment.

FIG. 10 is a flow diagram of a method 1000 for operating an interface circuit for converting a serial data stream to parallel data and a data strobe signal, according to an embodiment. The method 1000 may be performed by processing logic that may comprise hardware (e.g., circuitry, dedicated logic, programmable logic, microcode, etc.), software (e.g., instructions run on a processing device to perform hardware simulation), or a combination thereof. In one embodiment, the method 1000 is performed by the SDB device 110 of FIG. 1. In one embodiment, the method 1000 is performed by the interface circuit 500 of FIG. 5. In one embodiment, the method 1000 is performed by the SDB devices 704 of FIG. 7. In another embodiment, the method 1000 is performed by any of the interface circuits of FIGS. 1-9.

Referring to FIG. 10, at block 1002, method 1000 begins by the processing logic receiving a serial data stream from a host device. The processing logic converts the serial data stream to parallel data and a data strobe signal associated with the parallel data using N-bit header fields inserted into the serial data stream (block 1004). The N-bit header fields specify DQS preamble information for the parallel data. The processing logic provides the parallel data and the DQS signal to a memory device (block 1006), and the method 1000 ends.

In another embodiment, the processing logic converts the serial data at block 1004 by converting the serial data stream into N-bit packets. The N-bit packets comprise at least the parallel data and a preamble packet. The processing logic decodes the N-bit packets. The processing logic generates the DQS signal in response to the preamble packet being decoded. The DQS preamble information includes a DQS pattern corresponding to a clock cycle (tCKs) duration for a DQS period of the memory device.

In another embodiment, the N-bit header fields include a synchronization packet, a synchronization and preamble packet, and a start of data transfer packet. The N-bit header fields are two clock cycles in duration. In another embodiment, the N-bit header fields include zero or more synchronization packets, a synchronization and preamble packet, and a start of data transfer packet.

It is to be understood that the above description is intended to be illustrative, and not restrictive. Many other implementations will be apparent to those of skill in the art upon reading and understanding the above description. The scope of the disclosure should, therefore, be determined with reference to the appended claims, along with the full scope of equivalents to which such claims are entitled.

In the above description, numerous details are set forth. It will be apparent, however, to one skilled in the art, that the aspects of the present disclosure may be practiced without these specific details. In some instances, well-known structures and devices are shown in block diagram form, rather than in detail, in order to avoid obscuring the present disclosure.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "receiving," "determining," "selecting," "storing," "setting," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present disclosure also relates to an apparatus for performing the operations herein. This apparatus may be specially constructed for the required purposes, or it may comprise a general-purpose computer selectively activated or reconfigured by a computer program stored in the computer. Such a computer program may be stored in a computer-readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will appear as set forth in the description. In addition, aspects of the present disclosure are not described with reference to any particular programming language. It will be appreciated that a variety of programming languages may be used to implement the teachings of the present disclosure as described herein.

Aspects of the present disclosure may be provided as a computer program product, or software, that may include a machine-readable medium having stored thereon instructions, which may be used to program a computer system (or other electronic devices) to perform a process according to the present disclosure. A machine-readable medium includes any procedure for storing or transmitting information in a form readable by a machine (e.g., a computer). For example, a machine-readable (e.g., computer-readable) medium includes a machine (e.g., a computer) readable storage medium (e.g., read-only memory ("ROM"), random access memory ("RAM"), magnetic disk storage media, optical storage media, flash memory devices, etc.).

What is claimed is:

1. An integrated circuit device comprising:
   at least one serial data terminal; and
   an interface circuit coupled to the at least one serial data terminal, wherein the interface circuit is to receive a serial data stream and convert the serial data stream to parallel data and a data strobe (DQS) signal associated with the parallel data using N-bit header fields inserted into the serial data stream, wherein the N-bit header fields specify DQS preamble information for the parallel data.

2. The integrated circuit device of claim 1, wherein the interface circuit comprises:
   a deserializer circuit to receive the serial data stream and to convert the serial data stream into N-bit packets, wherein the N-bit packets comprise at least the parallel data and a preamble packet;
   a latch coupled to an output of the deserializer circuit to store the N-bit packets;
   a packet decoder coupled to the latch, the packet decoder to decode the N-bit packets and output the parallel data and the DQS signal;
   a set of line drivers coupled to the packet decoder, the set of line drivers to drive data signals corresponding to the parallel data on a set of data lines of a memory device; and
   a strobe driver coupled to the packet decoder, the strobe driver to drive the DQS signal on a strobe line of the memory device.

3. The integrated circuit device of claim 2, wherein the deserializer circuit comprises:
   a deserializer to receive the serial data stream and to store bits of the serial data stream into one of a first buffer or a second buffer;
   the first buffer to store a first portion of the N-bit packet according to a boundary indicator; and
   the second buffer to store a second portion of the N-bit packet according to the boundary indicator, wherein the first portion and the second portion are barrel shifted out of the first buffer and the second buffer as the N-bit packet.

4. The integrated circuit device of claim 3, wherein the deserializer is a 1:N deserializer, where N is an integer greater than one.

5. The integrated circuit device of claim 2, wherein the packet decoder comprises a finite state machine (FSM).

6. The integrated circuit device of claim 1, wherein the interface circuit comprises:
   a deserializer circuit to receive the serial data stream and to convert the serial data stream into N-bit packets, wherein the N-bit packets comprise at least the parallel data;
   a set of latches coupled to an output of the deserializer circuit to store the N-bit packets over multiple clock cycles;
   a multiplexer coupled to outputs of some of the set of latches;
   a packet decoder coupled to an output of a first latch in the set of latches and an output of the multiplexer, the packet decoder to decode the N-bit packets and output the parallel data and the DQS signal;
   a set of line drivers coupled to the packet decoder, the set of line drivers to drive data signals corresponding to the parallel data on a set of data lines of a memory device; and
   a strobe driver coupled to the packet decoder, the strobe driver to drive the DQS signal on a strobe line of the memory device.

7. The integrated circuit device of claim 1, wherein the DQS preamble information is programmable to comprise at least one of a plurality of DQS patterns, each DQS pattern corresponding to a different clock cycle (tCKs) duration for a DQS period.

8. The integrated circuit device of claim 1, wherein the N-bit header fields comprises at least one synchronization (sync) packet, a preamble packet, and a start of data packet, wherein the sync packet comprises a first sequence of bits, the preamble packet comprises a second sequence of bits specifying the DQS preamble information, and the start of data packet comprises a third sequence of bits, wherein the first sequence, the second sequence, and the third sequence are different.

9. A memory system comprising:
   an integrated circuit memory device that operates according to a parallel data and strobe scheme; and
   an interface circuit to receive a serial data stream from a host and convert the serial data stream to the parallel data and strobe scheme by using N-bit header fields inserted into the serial data stream, wherein each of the N-bit header fields comprises an information field that specifies data strobe (DQS) preamble information for the parallel data and strobe scheme.

10. The memory system of claim 9, wherein the interface circuit comprises:
    a serial data terminal coupled to the host; and
    a set of parallel data terminals coupled to data terminals of the integrated circuit memory device; and
    a strobe terminal coupled to a strobe terminal of the integrated circuit memory device.

11. The memory system of claim 10, wherein the interface circuit further comprises:
    a deserializer circuit to receive the serial data stream and to convert the serial data stream into N-bit packets, wherein the N-bit packets comprise at least the parallel data and a preamble packet;
    a latch coupled to an output of the deserializer circuit to store the N-bit packets;
    a packet decoder coupled to the latch, the packet decoder to decode the N-bit packets and output the parallel data and a DQS signal;
    a set of line drivers coupled to the packet decoder, the set of line drivers to drive data signals corresponding to the parallel data on the set of parallel data terminals; and
    a strobe driver coupled to the packet decoder, the strobe driver to drive the DQS signal on the strobe terminal.

12. The memory system of claim 11, wherein the packet decoder comprises a finite state machine (FSM).

13. The memory system of claim 11, wherein the deserializer circuit is a 1:N deserializer, where N is an integer greater than one.

14. The memory system of claim 9, wherein the N-bit header fields comprises:
    one or more synchronization packets, each synchronization packet comprising a first binary sequence of N bits;

a synchronization and preamble packet comprising a second binary sequence of N bits; and a start of data transfer packet comprising a third binary sequence of N bits.

15. The memory system of claim 9, wherein the N-bit header fields are one or more clock cycles in duration.

16. The memory system of claim 15, wherein the N-bit header fields comprises zero or more synchronization packets, a synchronization and preamble packet, and a start of data transfer packet.

17. A method of operating an interface circuit, the method comprising:

receiving a serial data stream from a host device;

converting the serial data stream to parallel data and a data strobe (DQS) signal associated with the parallel data using N-bit header fields inserted into the serial data stream, wherein the N-bit header fields specify DQS preamble information for the parallel data; and providing the parallel data and the DQS signal to a memory device.

18. The method of claim 17, wherein converting the serial data stream to the parallel data and the DQS signal comprises:

converting the serial data stream into N-bit packets, wherein the N-bit packets comprise at least the parallel data and a preamble packet;

decoding the N-bit packets; and generating the DQS signal in response to the preamble packet being decoded.

19. The method of claim 17, wherein the DQS preamble information comprises a DQS pattern corresponding to a clock cycle (tCKs) duration for a DQS period of the memory device.

20. The method of claim 17, wherein the N-bit header fields comprises zero or more synchronization packets, a synchronization and preamble packet, and a start of data transfer packet, and wherein the N-bit header fields are two clock cycles in duration.

* * * * *